(12) United States Patent
Zhang

(10) Patent No.: US 10,879,876 B2
(45) Date of Patent: Dec. 29, 2020

(54) RESOURCE CONSERVING WEIGHTED OVERLAP-ADD CHANNELIZER

(71) Applicant: Hughes Network Systems, LLC, Germantown, MD (US)

(72) Inventor: Hanhui Zhang, Clarksburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 122 days.

(21) Appl. No.: 16/283,770

(22) Filed: Feb. 24, 2019

(65) Prior Publication Data

US 2020/0274524 A1 Aug. 27, 2020

(51) Int. Cl.
*H03H 17/02* (2006.01)
*H03H 17/08* (2006.01)
*H03H 17/00* (2006.01)

(52) U.S. Cl.
CPC .... *H03H 17/0213* (2013.01); *H03H 17/0201* (2013.01); *H03H 17/0266* (2013.01); *H03H 17/08* (2013.01); *H03H 2017/0081* (2013.01); *H03H 2017/0214* (2013.01)

(58) Field of Classification Search
CPC ........... H03H 17/0213; H03H 17/0201; H03H 17/08; H03H 17/0266; H03H 17/008; H03H 2017/0214
USPC .................................................. 708/300–323
See application file for complete search history.

(56) References Cited

U.S. PATENT DOCUMENTS

| 10,230,407 | B2 * | 3/2019 | Zhang ..................... H04B 1/001 |
| 2002/0106009 | A1 | 8/2002 | Harrison |
| 2017/0070210 | A1 * | 3/2017 | Kultran .................... H03F 1/301 |

OTHER PUBLICATIONS

Wang et al., "Flexible Filter Bank Based on an Improved Weighted Overlap-Add Algorithm for Processing Wide Bandwidth Radio Astronomy Signals," Publications of the Astronomical Society of the Pacific, 127:1263-1268, Dec. 2015.
International Search Report and Written Opinion dated Jun. 25, 2020 by the International Searching Authority (European Patent Office) in PCT Application PCT/US2020/019498.
Danesfahani et al., "Multirate Extensions to Cossap and Lessons Learnt from Developing Advanced Models", The Institute of Electrical Engineers, Jan. 1, 1993, 6 pages.
Nang et al., "Channelized Receiver with Wola Filterbank", Proceedings of 2006 CIE International Conference on Radar, IEEE 2006, 3 pages.
Brennan et al., "Adaptive Filtering Using a Highly Oversampled Weighted Overlap-Add Filterbank in an Ultra-Low-Power System", Asilomar Conference on Signals, Systems and Computers, IEEE 2002, pp. 806-810.
Kurth et al., "A Per-Channel, Memory-Oriented Transmultiplexer with Logarithmic Processing", 8089 IEEE Transactions on Communications, vol., COM-30 (1982) Jul., No. 7, Part 1.

* cited by examiner

*Primary Examiner* — Tan V Mai
(74) *Attorney, Agent, or Firm* — NovoTechIP International PLLC

(57) ABSTRACT

Systems and methods are provided for channelizing. A first stage can provide a WOLA filter bank that can apply a single multiplier resource to perform window weighting for multiple WOLA filter banks. The first stage can remove mixer-based post FFT adjustment and provide equal functionality with a particular modification of tuning mixers at inputs of second stage FIR paths. The first stage can include a variable decimation, using a particular implementation of variable sample block size.

21 Claims, 8 Drawing Sheets

RESOURCE CONSERVING WEIGHTED OVERLAP-ADD CHANNELIZER

BACKGROUND

Frequency-division multiple access (FDMA) can simultaneously communicate multiple signals by assigning each a different frequency band among a plurality of available bands within a larger band. Such bands can be termed "sub-bands." An FDMA receiver can receive, at its antenna, all of the plurality of sub-bands. To recover a particular signal assigned to a particular sub-band, the FDMA receiver can pass the received multiple sub-band signal through a band-pass filter, having a passband centered on the corresponding to the sub-band's bandwidth, and tuned to the channel's center frequency. The bandpass filter output can be demodulated and decoded to retrieve the desired signal.

Multiple-channel FDMA receivers can concurrently recover a plurality of signals, respectively assigned to a plurality of the sub-bands. Multiple-channel FDMA receivers can include a bank of parallel band-pass filters, or a "filter-bank," feeding a demodulation/decoding apparatus. An integer N-channel FDMA receiver can provide various flexibility by including a switch between the filter bank and a demodulation block that can select, demodulate and decode integer N of the sub-bands. The filter banks can be implemented as FFT (Fast-Fourier Transform) based-filters.

FFTs, though, can be computationally intensive and FFT-based filter banks must operate in real time. As simple rates increase, technical difficulties can arise.

SUMMARY

This Summary identifies features and aspects of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

Among examples of disclosed system are implementations that include a channelizer, which can include a buffer that can be configured to store a sequence of signal samples, a weighting logic, and a weighting logic, which can be coupled to the window buffer and can be configured to apply a sequence of weighting coefficients to the sequence of signal samples, and output a corresponding sequence of weighted signal (WST) samples. Implementations can include a regrouping logic, which can be configured to group the WST samples into a concatenation of D WST sample blocks, each of the D WST sample blocks including K WST samples, K being an integer, a time folding logic, which can be configured to generate a first time-folded sum, based at least in part on a summation of the D WST sample blocks, and a second time-folded sum based at least in part on a summation of a first plurality of the D WST sample blocks and a subtraction of a second plurality of the D WST sample blocks, and can include a mixer logic that can be configured to frequency shift the second time-folded sum and output a corresponding adjusted second time-folded sum, and can include a first discrete Fourier Transform logic, which can be configured to generate a first plurality of bandpass outputs, based at least in part on applying a discrete Fourier Transform to the first time-folded sum, and can include a second discrete Fourier Transform logic that can be configured to generate a second plurality of bandpass outputs, based at least in part on applying a discrete Fourier Transform to the adjusted second time-folded sum.

Among examples of disclosed method are a method for channelizing and implementations can include shifting a new block of D new samples into a window buffer, D being an integer, and applying weighting coefficients to a window of L samples from the window buffer and outputting corresponding weighted signal (WST) samples, L being an integer, and can include re-grouping the WST samples into a plurality of WST sample blocks. Such implementations can also include time folding the plurality of WST sample blocks according to a first time-folding process, to generate a first K-element sum, K being an integer, and time folding the plurality of WST sample blocks according to a second time-folding process, to generate a second K-element sum and can include frequency adjusting the second K-element sum to generate an adjusted second K-element sum, and generating a first plurality of bandpass outputs, based at least in part on applying a discrete Fourier Transform to the first K-element, and can include generating a second plurality of bandpass outputs, based at least in part on applying a discrete Fourier Transform to the adjusted second K-element sum.

Also among examples of disclosed systems are a channelizer, and implementations can include window buffer, configured to hold a sliding window of integer L signal samples, a weighting logic that can be configured to apply a weighting to the L signal samples and output corresponding weighted signal (WST) samples, and can include an overlap-add (OLA) logic, which can be configured to generate a first K-element OLA sum and a second K-element sum, each kth element of the first K-element OLA sum being based at least in part on a sum of kth symbols in each of a plurality of blocks of the K WST samples, the plurality of blocks of K WST samples including first blocks and second blocks, and each kth element of the second K-element OLA sum based at least in part on a sum of respective kth symbols of the second blocks subtracted from a sum of kth symbols of the first blocks. Implementations can also include a phase adjustment logic that can be configured to apply a phase adjustment to the second K-element OLA sum and generate a corresponding adjusted second K-element OLA sum, and can include a first discrete Fourier Transform logic that can be configured to apply a K-point first discrete Fourier Transform to the first K-element OLA sum and output a resulting first plurality of sub-band outputs, and a second discrete Fourier Transform logic, which can be configured to apply a K-point second discrete Fourier Transform to the adjusted second K-element OLA sum, and output a resulting second plurality of sub-band outputs.

BRIEF DESCRIPTION OF THE DRAWINGS

The accompanying drawings are presented to aid in the description of example aspects and are provided solely for illustration of the embodiments and not limitation thereof.

DETAILED DESCRIPTION

Aspects and features, and exemplary implementations practices and applications are disclosed in the following description and related drawings. Alternatives to disclosed examples may be devised without departing from the scope of disclosed concepts.

The word "exemplary," as used herein, means "serving as an example, instance, or illustration." Any aspect described herein as "exemplary" is not necessarily to be construed as preferred or advantageous over other aspects. In addition, description of a feature, advantage or mode of operation in relation to an example combination of aspects does not require that all practices according to the combination include the discussed feature, advantage or mode of operation.

As used herein, the singular forms "a", "an" and "the" are intended to include the plural forms as well, unless the context clearly indicates otherwise.

As used herein, the terms "comprise(s)," "comprising," include(s), "and "including", indicate presence of one or more recited structures, components, features, capabilities, modes, steps, operations, or combinations thereof, but do not exclude presence of one or more additional or other structures, components, features, capabilities, modes, steps, operations, or combinations thereof.

Figure 1:
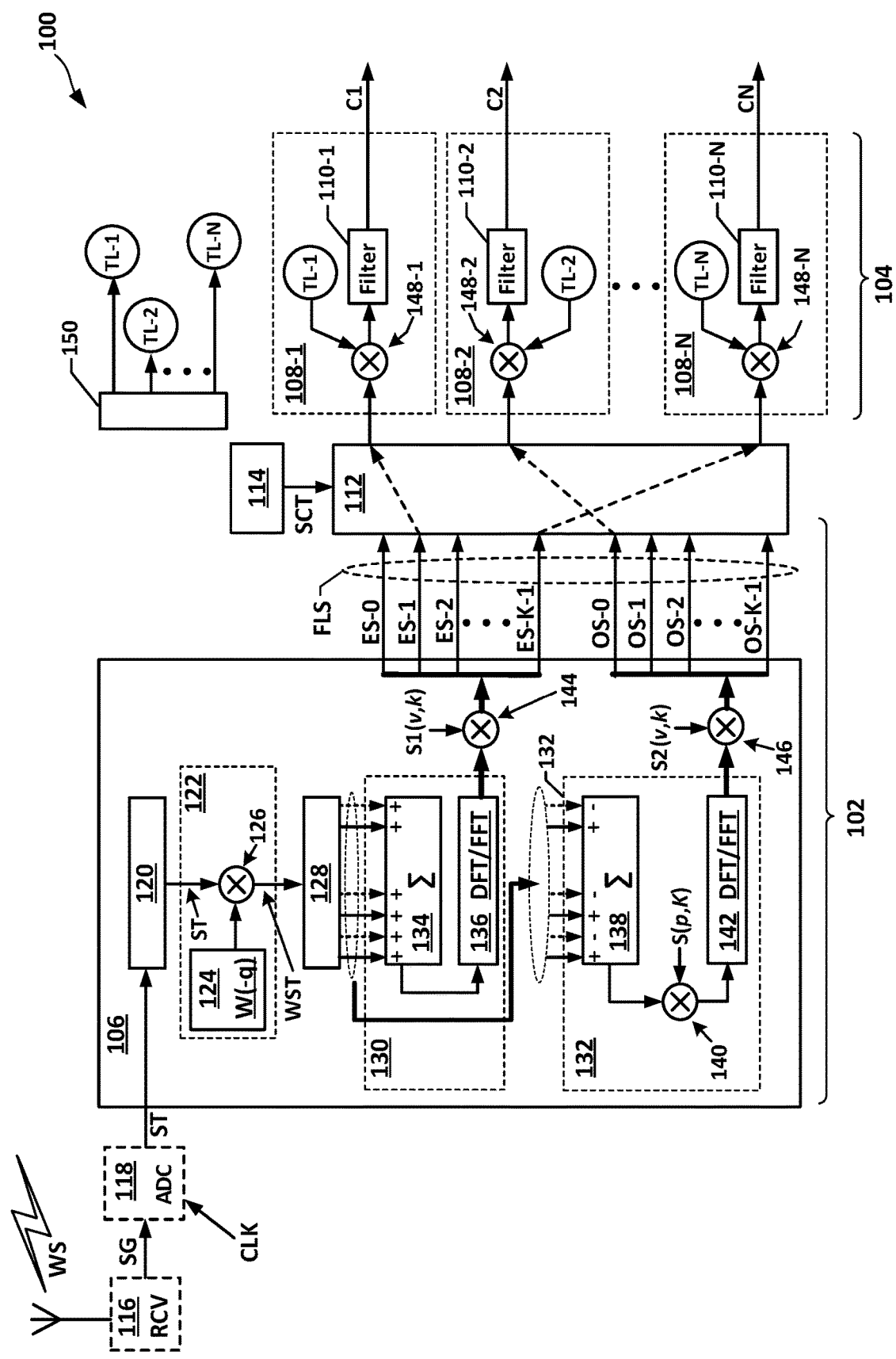
FIG. 1 shows a high level functional block diagram of one example two-stage channelizer system, the first stage including a resource-conserving (RSC), weighted overlap-add ("WOLA") sub-band filter ("SBF") logic according to various aspects.

FIG. 1 shows a functional block diagram of an example two-stage channelizer system 100 (hereinafter alternatively recited as "system 100") that can include a first stage 102 feeding a second stage 104. The first stage 102 can be configured to receive a sampling ST of an information frequency band SG and apply a "coarse" or first level channelization of ST into plurality of sub-band streams. The second stage 104 can be configured to receive a selected sub-plurality, for example, integer N of the plurality of sub-band streams output from the first stage 102 and apply a fine or second level channelization to recover desired FDMA channel data for decoding.

In an implementation, the first stage 102 can feature a particularly configured WOLA-type sub-band filter logic 106, which can channelize the information frequency band SG into integer 2K sub-bands, and output these as integer 2K first level sub-band sample streams (collectively labeled on FIG. 1 as "FLS"). To avoid word repetition, the phrase "sub-band filter" will be alternatively recited as "SBF."

Implementation of the second stage 104 second level channelization functions can include integer N tunable passband filtered channel paths 108-1, 108-2, . . . , 108-N, which for purposes of description will be collectively referred to as "tunable pass band filtered channel paths 108." Each of the tunable pass band filtered channel paths 108 can include a digital filter logic, such as the visible examples 110-1, 110-2, . . . , 110-N, which will be collectively referred to as "digital filters 110." The digital filters 110 can be implemented, for example, as finite-impulse-response (FIR) filters. Such implementation can adapt FIR techniques known to persons of ordinary skill in the pertinent arts, which can be readily selected adapted by such persons by applying standard engineering methodologies, combined with guidance from this disclosure. Accordingly, further detailed description of FIR implementation of the digital filters 110 is omitted from this disclosure.

The first stage 102 can include logic such as an N-from-2K cross-bar switch 112 that can be configured to select N of the 2K FLS sub-band sample streams, and feed each of the selected N to a particular one of the N tunable pass band filtered channel paths 108. The selection and assignment operations of the N-from-2K cross-bar switch 112 can be controlled, for example, by an N-from-2K control signal SCT that can be generated by a control logic 114. For reasons that can include, for example, computation burden of FIR filters, integer N can be substantively smaller than integer 2K.

The information frequency band SG can be a baseband or other frequency band output, for example, from a radio frequency (hereinafter "RF") receiver 116. SG can be, for example, a downshifted multi-channel FDMA spectrum region, from a wireless communication signal (labeled on FIG. 1 as "WS") carrying a plurality of FDMA signals (not separately visible in FIG. 1) according to a given FDMA scheme. The sample stream ST can be generated by an analog-to-digital converter (ADC) 118.

The WOLA-type SBF logic 106 can be configured such that the 2K sub-band streams FLS include integer K "even" sub-band streams (labeled on FIG. 1 as "ES-0," "ES-1," "ES-2," . . . , "ES-K-1," collectively referred to as "even sub-band streams ES"), and integer K "odd" sub-band streams (labeled on FIG. 1 as "OS-0," "OS-1," "OS-2," . . . , "OS-K-1," collectively referred to as "odd sub-band OS"). It will be understood that "even" and "odd" as used in this disclosure are reference terms to distinguish between two sets of K sub-bands and have no inherent meaning. Each of the K even sub-band streams ES can be generated at a sampling rate that meets Nyquist sampling of a corresponding one of K "even" sub-bands (not separately visible in FIG. 1) that in the aggregate can span the signal band SG. The even sub-band ES center-to-center spacing along the frequency axis, however, can be such that notch-like attenuation regions can appear between adjacent ES sub-bands. Similarly, each of the K odd sub-band streams ES can be a Nyquist sampling of a corresponding one of K "odd" sub-bands (not separately visible in FIG. 1) also spanning, in the aggregate, the signal band SG. The odd sub-band OS frequency spacing, though, can creates notch-like attenuation regions midway between adjacent OS sub-bands.

As will be described in greater detail later in subsequent paragraphs the WOLA-type SBF logic 106 can be configured to frequency shift the K odd sub-bands OS in unison by one-half of the sub-bands' center-to-center spacing. Such shifting can align the center of each odd sub-band OS at the midpoint between corresponding adjacent even sub-bands ES and can similarly align the centers of the even sub-bands ES midpoint between adjacent odd sub-bands OS. The superposition of the even sub-bands ES and odd sub-bands OS can provide an approximately constant frequency response over, for example, the multi-channel FDMA band within the information band SG. Demodulation of a specific FDMA channel can be performed, for example, by assigning the ES or OS sub-band containing the channel to a specific tunable pass band filtered channel path 108, combined with centering the channel with the path 108 passband, as will be described in greater detail in later sections of this disclosure. The output of the specific tunable band-pass filtered channel path 108 can then be fed to a demodulation resource (not separately visible in FIG. 1).

Figure 2:
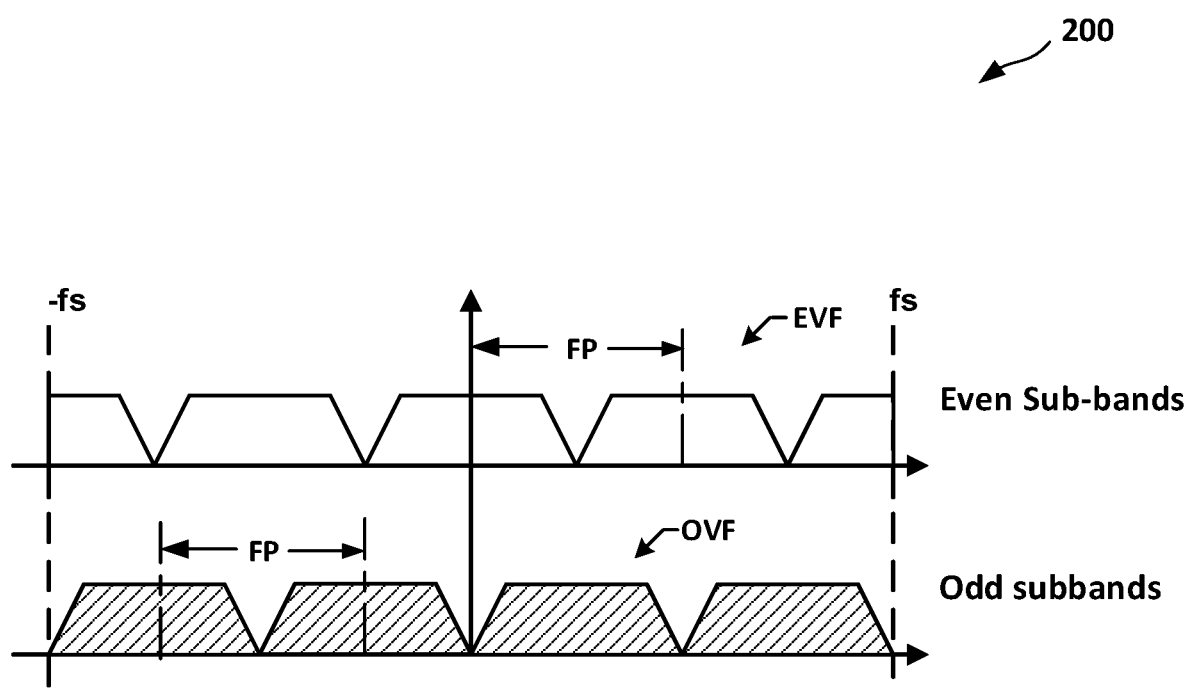
FIG. 2 shows a simulated frequency characteristic of an offset, even-odd sub-band WOLA channelizer according to various aspects.

FIG. 2 shows one example 200 of the above-described superposed mutually offset sub-bands ES and OS, shown by frequency-magnitude plot lines EVF and OVF. The arrangement 200 uses integer 4 as an example K value, as visible by EVF forming 4 even sub-bands, (visible, but not separately labeled, and one being two half-bands) and OVF forming 4 odd sub-bands (visible, but not separately labeled). The odd sub-bands OVF are offset along the frequency axis, one-half of the center-to-center frequency spacing, labeled "FP."

Referring to FIG. 1, in an implementation, the WOLA-type SBF logic 106 can include particular technical features that can provide, among other technical benefits, conservation of resources, as described in greater detail in later paragraphs. To avoid word repetition, the phrase "resource-conservation" will be alternatively recited as "RSC," which is an arbitrary abbreviation coined for purposes of this disclosure. The WOLA-type SBF logic 106 will therefore be alternatively recited as "RSC WOLA-type SBF logic 106. In addition, alternative and supplementary implementations that feature, for example, certain complementary modifications of the first stage 102 and second stage 104 can provide, among other further technical benefits, additional resource conservation, and are also described in greater detail in later sections.

In an implementation, the RSC WOLA SBF logic 106 can include, among other features, a window buffer 120 configured to store a window of integer L of the ST samples. The window buffer 120 can be configured to store the L samples as a sliding, first-in-first-out (FIFO) arrangement of integer K concatenated blocks (not visible in FIG. 1). Each of the integer K blocks can be configured as a sequence of integer D samples ST. The RSC WOLA SBF logic 106 can be configured such that at each cycle in a succession of cycles, a new block of D samples ST can be shifted into the window buffer 120, i.e., the L sample window can be "slid" by one block.

Technical features of the RSC WOLA SBF logic 106 can also include, among others, a settable decimation rate, i.e., the sample rate at which the logic 106 generates sub-band streams ES and OS. An implementations of the RSC WOLA SBF logic 106 can also provide "on-the-fly" variation of the decimation rate based, at least in part, on a varying of D.

The RSC WOLA SBF logic 106 can include a window weighting logic 122 that can be implemented, for example, with a weighting coefficient logic 124 and a multiplier logic 126, configured such that the weighting co-efficient logic 124 feeds a sequence of weighting coefficients, W(−q), to one of the multiplier 126 two operand ports (visible in FIG. 1 but not separately labeled), in synchronization with the window buffer 120 feeding ST samples to the other of the multiplier 126 operand ports. The index "q" can correspond to a position within the current window of L samples stored in the window buffer 120, e.g., the index q can increment according to q=0, 1, . . . , L-1. Configured as such, the window weighting logic 122 can multiply the buffer 120 window of L baseband samples ST, element-by-element, by the W(−q) sequence to form a corresponding L weighted baseband samples ST (labeled "WST" on FIG. 1).

Regarding implementation of the window weighting logic 122, selection of the multiplier 126 technology and architecture, as well as functional parameters, e.g., number of bits for the operands, and whether operands are fixed or floating point, can be application-specific. Such selection can be readily performed by persons of ordinary skill in the pertinent arts facing a given application, by applying standard engineering methodologies known to such persons, in combination with guidance from the present disclosure. Further detailed description of implementations of the multiplier logic 126 is therefore omitted. Example implementations of the weighting coefficient logic 124 can include, without limitation, receiving the weighting co-efficients W(−q) from an external source (not visible in FIG. 1) or, as one example alternative, storing W(−q) in a storage resource (not explicitly visible in FIG. 1), e.g., a non-volatile memory device or an available storage capacity of any component or subsystem implementing the system 100. Another example implementation of the weighting coefficient logic 124 can include, alone or in combination with any of the above-identified implementations, computer-executable instructions stored, for example, in a storage device coupled to a processor (not explicitly visible in FIG. 1), that when read and executed by the processor, can cause the processor to perform a process that can generate the weighting co-efficients W(−q).

Referring to FIG. 1, an implementation of the RSC WOLA SBF logic 106 can include a regrouping buffer 128 that can be configured to receive WST from the weighting logic 122, regroup and store the WST samples as integer D concatenated WST sample blocks (not separately visible in FIG. 1). In an aspect, each of the WST sample blocks can include integer K WST samples, arranged in their original sampling order. The value K can be the configured size K of the respective Fast Fourier Transform (FFT) applied by the each of the first and second WOLA filter bank logics 130, 132. The regrouping buffer 128 can be configured to feed content of integer D concatenated blocks to the first and second WOLA filter bank logics 130, 132, as described in greater detail in subsequent paragraphs.

The first WOLA filter bank logic 130 can include a first WOLA time-folding logic 134 that can be configured to generate, based on samples received from the regrouping buffer 128 a time-folded K-element block (not explicitly visible in FIG. 1) for feeding to a first K-point FFT logic 136. The first WOLA time-folding logic 134 can be configured to generate the time-folded K-element blocks such that each kth element can be a sum of the respective kth WST sample from each of the concatenated WST sample blocks stored in the regrouping buffer 128. Particular implementations of the WOLA time-folding logic 134 will be described in greater detail in later sections of this disclosure.

The first WOLA time-folding logic 134 can be configured to generate the time-folded K-element blocks it feeds to the first K-point FFT logic 136 according to the following Equation (1):

$$TF(n) = \sum_{m=0}^{m=\left(\frac{L}{K}\right)-1} WST(n+mK),$$

$$\text{for } n = 0, 1, \ldots, K-1$$

Equation (1)

where,
TF is the K-sample time-folded summation,
TF(n) is the nth sample of TF, and
WST(n+mK) is the WST sample value in the (n+mK) position of the regrouping buffer 128.

The second WOLA filter bank logic 132 can include a second WOLA time-folding logic 138, configured to generate, based on the same samples from the regrouping buffer, a different form of time-folded K-element block, and to provide that K-element block to pre-FFT phase-adjustment logic 140 for feeding to a second K-point FFT logic 142. For convenience in subsequent paragraph descriptions of the time-folded K-element block output from the second WOLA time-folding logic 138 logic, the block will be referred to as "alternating sign summation, time-folded K-element block."

The second WOLA time-folding logic 138 can be configured to generate the alternating sign summation, time-folded K-element block it provides to the pre-FFT phase adjustment logic 140 according to the following Equation (2):

$$TR(n) = \sum_{m=0}^{m=\left(\frac{L}{K}\right)-1} WST(n+mK)*(-1)^m,$$

$$\text{for } n = 0, 1, \ldots, K-1$$

Equation (2)

where,
TR is the K-sample time-folded add-subtract summation,
TR(n) is the nth sample of TR, and
WST(n+mK) is as defined in Equation (1).

The pre-FFT phase-adjustment logic 140 can be configured, for example, to apply the phase adjustment S(p, K) in accordance with the following Equation (3):

$$S(p, K) = e^{-\frac{j\pi p}{K}}, \text{ for } n = 0, 1, \ldots, K-1$$

Equation (3)

The regrouping buffer 128 and the first WOLA time-folding logic 134 can be configured to operate in synchronization such that, at each of the successive cycles at which another block of samples ST is input to the window buffer 102, another time-folded K-element block can be output from the logic 134 and fed to the first K-point FFT logic 136. The regrouping buffer 128 and the second WOLA time-folding logic 138 can be likewise configured to operate in synchronization such that, at each of the above referenced successive cycles, another alternating sign summation, time-folded K-element block can be provided to the pre-FFT phase-adjustment logic 140 for adjustment and feeding as the K inputs to the second K-point FFT logic 142.

Referring to FIG. 1, the RSC WOLA SBF logic 106 can include a first post-FFT adjustment multiplication logic 144, which can be configured to receive output of the first K-point FFT logic 136, apply adjustment according to the following Equation (4), and deliver the result to the N-from-2K cross-bar switch 112:

$$S1(v,k) = e^{-j2\pi k v D/K}$$

Equation (4)

The RSC WOLA SBF logic 106 can similarly include a second post-FFT adjustment multiplication logic 146, which can be configured to receive output of the second K-point FFT logic 142, apply adjustment according to the following Equation (5), and deliver the result to the N-from-2K cross-bar switch 112:

$$S2(v,k) = e^{-j2\pi v D(2k+1)/K}$$

Equation (5)

The output of the first post-FFT complex multiplication logic 144, can be the even sample streams ES-0, ES-1, ..., ES-K-1, and the output of second post-FFT complex multiplication logic 146 can be OS-0, OS-1, ..., OS-K-1.

The present inventor notes computational cost of each the first and second post-FFT adjustment multiplication logics 144 and 146 carries a significant number of complex multiplications logic, or consumption of computational resources for performing complex multiplication. Described later in this disclosure is an implementation that, combining a modification of the first stage 102 with a complementary, particularly modified second stage 104, can provide, among other features, substantive elimination of the above-described implementation cost.

As described above, the first stage 102 can be configured to select integer N of FLS and assign each of the N to a particular one of the N tunable pass-band filtered channel paths 108 provided by the second stage 104. The selection and assignment can be provided, as also described above, by N-from-2K cross-bar switch 112, controlled by control signal SCT generated, for example, by control logic 114. The control logic 114 can be implemented and configured in accordance with subject matter disclosed by application Ser. No. 15/210,233, filed Jul. 14, 2016, and entitled "Radio Receiver with Hybrid Channelizer Architecture," ("the '233 Application") which is incorporated by reference herein in its entirety. Examples of such subject matter are discussed in the '233 Application in reference to its FIG. 3.

Referring to FIG. 1 of the present disclosure, the N tunable pass-band filtered channel paths 108-0, 108-1, ..., 108-N-1 can include, respectively, first tuning mixer 148-1, second tuning mixer 148-1, ..., and Nth tuning mixer 148-N (collectively "tuning mixers 148"). Each of the tuning mixers 148 can receive a tunable mixing signal, labeled individually as TL-1, TL-2, ..., TL-N, (collectively referred to as "tuning signals TL"). The tuning signals TL can be generated, for example, by a tuning controller 150, and generation can include setting the TL frequencies to values that can be based on frequencies of information channels within the FLS sub-bands received at the tunable pass-band filtered channel paths 108. More specifically, the respective sub-bands FLS received at each tunable pass-band filtered channel path 108 can include information channels, and such channels are not necessarily centered in frequency to the center frequency of the digital filters 110 of the channel paths 108. The respective TL signals can therefore be set such that each tuning mixer 148 centers the information channel within its received FLS sub-band to the center frequency of the its path 108 digital filter 110. Implementation of the tuning controller 150, including its selection schemes for TL and its generation of TL, and implementation of the tuning mixers 148 can be, for example, in accordance with the mixers, control logic, and signal generator subject matter discussed in the '233 Application in reference to its FIG. 3.

As visible in FIG. 1, additional technical features provided by the system 100 can include, but are not limited to, the use of one weighting logic 122 to provide the window weighting functionality for both the first WOLA filter bank logic 130 and the second WOLA filter bank logic 132. In addition, as will be described in greater detail in reference to FIGS. 3, 5A, and 5B, implementations of the first WOLA time-folding logic 134 and the second WOLA time-folding logic 138 include implementations that can provide both functionalities by a single process. As will be understood and appreciated, these features can save resources, including but not limited to, integrated circuit area, or processing budget, or both.

Figure 3:
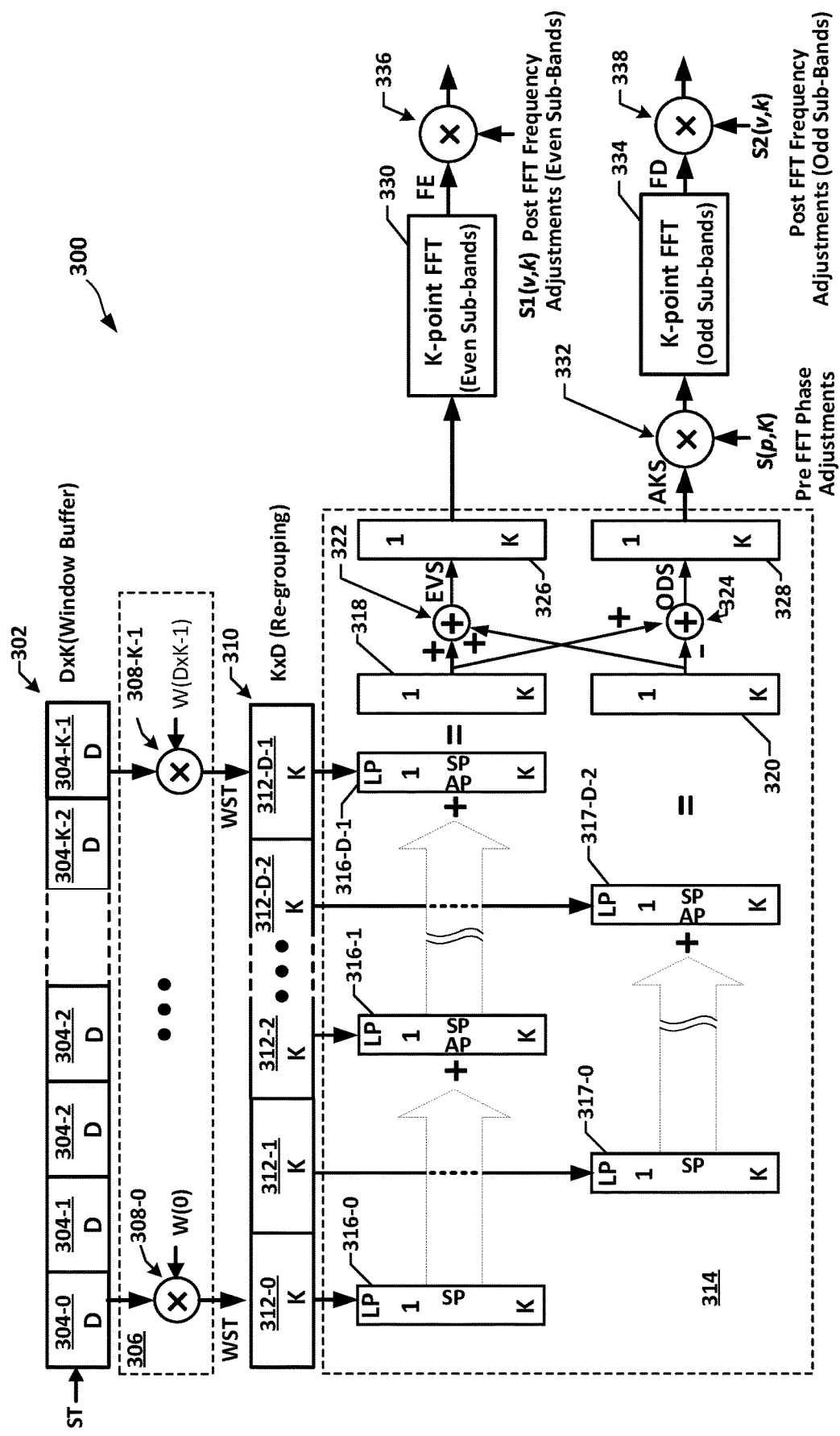
FIG. 3 shows a functional block schematic of one example implementation for the RSC WOLA SBF logic of the FIG. 1 first stage, according to various aspects.

FIG. 3 shows a functional block schematic of an example RSC WOLA SBF logic 300 (hereinafter "logic 300"), which can be an implementation of the FIG. 1 RSC WOLA SBF logic 106. The logic 300 can include a sample buffer 302, configured to receive the sample stream ST and to buffer a window of integer L sequential ST samples. The buffered samples ST will also be referred to as "raw" samples ST, to distinguish from post-weighted samples output from the window weighting logic 306, described in greater detail in subsequent paragraphs. The sample buffer 302 can be configured as a first-in-first-out (FIFO) register that can maintain the window of L raw samples ST as a concatenated sequence of K blocks, such as the FIG. 3 examples labeled 304-0, 304-1, 304-2, . . . , 304-K-1 (collectively "raw sample blocks 304"). In an implementation, each of the raw sample blocks 304 can include integer D raw samples ST, and such samples can be arranged or maintained in their original sampling order. For purposes of description, the sample buffer 302 will be alternatively referred to as "window buffer 302."

The window buffer 302 can be configured to operate in a cyclical manner, for example, in sync with a periodic event, such as a received sample ST counter (not explicitly visible in FIG. 3) reaching a count corresponding to integer D. Operations applied by the window buffer 302 in association with the cycle event can include shifting in a new block of raw samples ST, and correspondingly shifting all of the buffer 302 current raw sample blocks 304 by one block. Referred to the FIG. 3 viewing plane, such shifting can be represented as a left-to-right direction. Functionality of the window weighting logic 306 can include generating, retrieving or, for example, receiving from an external source a sequence of weight co-efficients $W(-q)$. This functionality can be provided, for example by a logic such as the weighting coefficient logic 124 described above for the system 100. As described, the index "q" can correspond to a position of ST within the sequence of L raw samples in the window buffer 302.

The window weighting logic 306 can include a multiplier logic 308 that can have L instances, labeled 308-0, . . . , 308-((D×K) −1), each instance being a multiplication of an ST sample by a $W(-q)$ co-efficient. The L instances can be implemented, for example, as described above for the FIG. 1 multiplier logic 126, e.g., by a single multiplier circuit (not separately visible in FIG. 3) performing L multiplications, or a sharing of multiplication across a plurality of multiplier circuits.

The regrouping buffer 310 can be configured to receive the L weighted samples WST output by the window weighting logic 306, and to logically arrange these as integer D concatenated blocks of WST samples, such as the examples labeled 312-0, 312-1, 312-2, . . . , 312-D-1 (collectively "weighted sample blocks 312." Each of the WST sample blocks 312 can include a sequence of K of the WST samples. Comparing respective block arrangements within the regrouping buffer 310 to the window buffer 302 shows the re-grouping functionality of the buffer 310, namely, regrouping the L samples ST after the WST weighting from a concatenation of integer K D-sample blocks to a concatenation of integer D K-sample blocks.

For purposes of description of aspects and operations, weighted sample blocks 312 having an even-valued index, e.g., weighted sample blocks 312-0, 312-2, . . . , 312-D-1 will be alternatively referred to as "even WST blocks 312E," and weighted sample blocks 312 having an odd-valued index, e.g., weighted sample blocks 312-1, 312-3, . . . , 312-D-2, will be alternatively referred to as "odd WST blocks 312D."

The logic 300 can include a WOLA time folding logic 314 that, in overview, can retrieve or can be provided with the content of the regrouping buffer 310 and, based on same, can generate the above-described outputs of the FIG. 1 first WOLA time-folding logic 134 and second WOLA time-folding logic 138. Accordingly, the regrouping buffer 310 and WOLA time folding logic 314 can be configured for cooperative performance, for example, in association with each cycle of shifting a new raw sample block 304 into the window buffer 302, of outputting another time-folded K-element block, in accordance with Equation (1), and another alternating sign summation, time-folded K-element block AFB, in accordance with Equation (2).

The FIG. 3 implementation of the WOLA time-folding logic 314 can include a first coupled succession of particularly configured K-element summing registers, such as the FIG. 3 examples 316-0, 316-2, . . . , 316-D-1 (collectively "first summing registers 316") and a second coupled succession of similarly configured K-element summing registers, such as the FIG. 3 examples 317-0, . . . , 317-D-2 (collectively "second summing registers 317"). For purposes of describing aspects and operations the first summing registers 316 and the second summing registers 317 will be collectively referenced as "K-element summing registers 316-317." Each of the K-element summing registers 316-317 can be configured with an operand loading port LP, a carry-in addend operand port AP, and a summation output port SP. Optionally, for the leftmost first K-element summing register 316-0 and the leftmost second summing register 317-0, the carry-in addend operand port AP can be omitted or fixed at logical 0. The K-element summing registers 316-317 can each be configured to sum the K-element operand received at its carry-in addend port AP (if any) to the K-element operand loaded via its operand loading port LP, and output a resulting K-element sum from its summation output port SP.

The first summing registers 316 can each be configured to receive the K-samples of a corresponding one of the K-sample even WST blocks 312E held in the regrouping buffer 310, and second summing registers 317 can each be configured to receive the K-samples of a corresponding one of the K-sample odd WST blocks 312D held in the regrouping buffer 310.

The summation output port SP of each of the first summing registers 316, with the exception of the rightmost register 316-D-1, can be logically coupled to the carry-in addend operand port AP of another of the first summing registers 316. The summation output port SP of each of the second summing registers 317, with the exception of the rightmost register 317-D-2, can be logically coupled to the carry-in addend operand port AP of another of the second summing registers 317.

An example operation will be described assuming the first summing registers 316 have been loaded with their respective K-sample even WST blocks 312E and the second summing registers 317 have been loaded with their respective K-sample odd WST blocks 312D. The K-element data output from the SP port of the leftmost first summing register 316-0, which can be unchanged from its loaded K-element even WST block 312E, can feed the carry-in addend port AP of its succeeding first summing register 316-1. The next first summing register 316-1 can sum the K-element operand fed to its carry-in addend port AP with its loaded K-element even WST block 312E, and output from its summation output port SP a first K-element first accumulated sum. The summations can continue until the rightmost first summing register 316-D-1 outputs from its summation output port SP an element-to-element sum of all first K-element summing register 316 content, i.e., an element-to-element sum of all K-sample even WST blocks 312E held by the regrouping buffer 310.

Concurrent, or partially concurrent or sequential with the above-described operations, depending on specific implementation, the leftmost second summing register 317-0 can feed, as a K-element data, the K-sample odd WST block 312D it was loaded with, to the carry-in addend port AP of a next summing register 317-1, and this can continue until the rightmost second summing register 317-D-2 outputs from its summation output port SP an element-to-element sum of all second summing register 317 content, i.e., an element-to-element sum of all K-sample odd WST blocks 312D held by the regrouping buffer 310.

In an implementation, the K-element summation output from the rightmost first summing register 316-D-1 can be latched by a first K-element latch 318, and the K-element summation output from the rightmost second summing register 317-D-2 can be latched by a second K-element latch 320.

The K-element sum output by the rightmost first summing register 316-D-1, generated by the logic 300 features as described, can be according to an even-index portion of the Equation (1) right side summation and the Equation (2) right side summation, where "even" in the context of "even-index portion" means even values of the equation's index "m." The K-element sum output from the rightmost second summing register 317-D-2, generated by the logic 300 features as described, can be according to an odd-index portion of the Equation (1) right side summation, where "odd" in this context means odd values of the equation's index "m." A negative sign applied to the K-element sum output from the rightmost second summing register 317-D-2 can be according to an odd-index portion of the Equation (2) right side. For purposes of subsequent paragraph description of aspects and operations, the K-element sum output from the rightmost first summing register 316-D-1 will be alternatively referred to as "K-element even block partial sum," and the K-element sum output from the rightmost second summing register 317-D-2 will be alternatively referred to as "K-element odd block partial sum."

A WOLA time-folding logic 314 can include a first K-element sum combiner 322 and a second K-element sum combiner 324. The first K-element sum combiner 322 can be configured to receive the K-element even block partial sum, for example, from the first latch 318 and the K-element summation output from, for example, the second K-element latch 320, and to generate a first K-element completed sum, which is labeled "EVS" on FIG. 3. The first K-element completed sum EVS that is provided by the logic 300 features as described, can be according to Equation (1). The second K-element sum combiner 324 can differ from the first K-element sum combiner 322 in that the operand logical port of the combiner 324 that receives the K-element summation output from, for example, the second K-element latch 320 is a logical subtraction port as opposed to a logical addition port. The second K-element completed sum, labeled "ODS" on FIG. 3, output from the second K-element sum combiner 324 is therefore the K-element odd block partial sum subtracted from the K-element even block partial sum. This provides an output according to Equation (2).

In an implementation, the first K-element completed sum EVS can be latched by a third K-element latch 326, and the second K-element completed sum ODS can be latched by a fourth K-element latch 328.

The logic 300 can include a first K-point FFT 330, configured to receive EVS and output a corresponding first K-point FFT result, which is labeled "CC1" on FIG. 3. The logic 300 can include a pre-FFT adjustment logic 332 configured to apply an adjustment, which can be in accordance with Equation (3) above, to ODS, and feed the adjustment result, which is labeled "AKS" on FIG. 3, to a second K-point FFT 334. The corresponding K-point FFT output from FFT 334 is labeled "CC2" on FIG. 3.

The logic 300 can include a first post-FFT adjustment logic 336, logically coupled to receive the first K-point FFT logic 330 output CC1, and a second post-FFT adjustment logic 338, logically coupled to receive the output CC2 of the second K-point FFT logic 334. The first post-FFT adjustment logic 336 can apply sample-by-sample complex-valued multiplications to CC1 from the first K-point FFT logic 330 according to Equation (4). The second post-FFT adjustment logic 338 can apply sample-by-sample complex-valued multiplications to CC2 from the second K-point FFT logic 334 according to Equation (5). Referring to FIGS. 1 and 3, the output of the first post-FFT adjustment logic 336, generated by the logic 300 features as described, can provide the FIG. 1 even sample streams ES-0, ES-1, . . . , ES-K-1, and the output of the second post-FFT adjustment logic 338, generated as described, can provide the FIG. 1 odd sample streams OS-0, OS-1, . . . , OS-K-1.

In one example modification of the above-described logic 300, functionality of the regrouping buffer 310 can be implemented by a cross-port logic (not visible in FIG. 3) that can, for example, receive the WST samples from the window weighting logic 306 and load the first block of K of the WST samples into the leftmost first summing register 316-0, then load the next block of K (i.e., second) of the WST samples into the leftmost second summing register 317-0, and then load the third block WST samples into the first summing register 316-1, and continue in that manner until the Dth block of K WST samples is loaded into one among the first and second summing registers 316-317.

Technical features provided by logic 300 can also include, but are not limited to, the single window buffer 302 and single window weighting logic 306 providing, respectively, a window buffer and window weighting functionality both for the first K-point FFT logic 330 in generating, via the first post-FFT adjustment logic 336, streams ES-0, ES-1, . . . , ES-K-1, and the second K-point FFT logic 334 in generating, via the second post-FFT adjustment logic 338, the odd sample streams OS-0, OS-1, . . . , OS-K-1. These features can conserve system resources, in implementation (e.g., integrated circuit area), or in operation, or both.

Implementation and operation of the first and second post-FFT adjustment logics 136 and 138 can be unwanted overhead.

Figure 4:
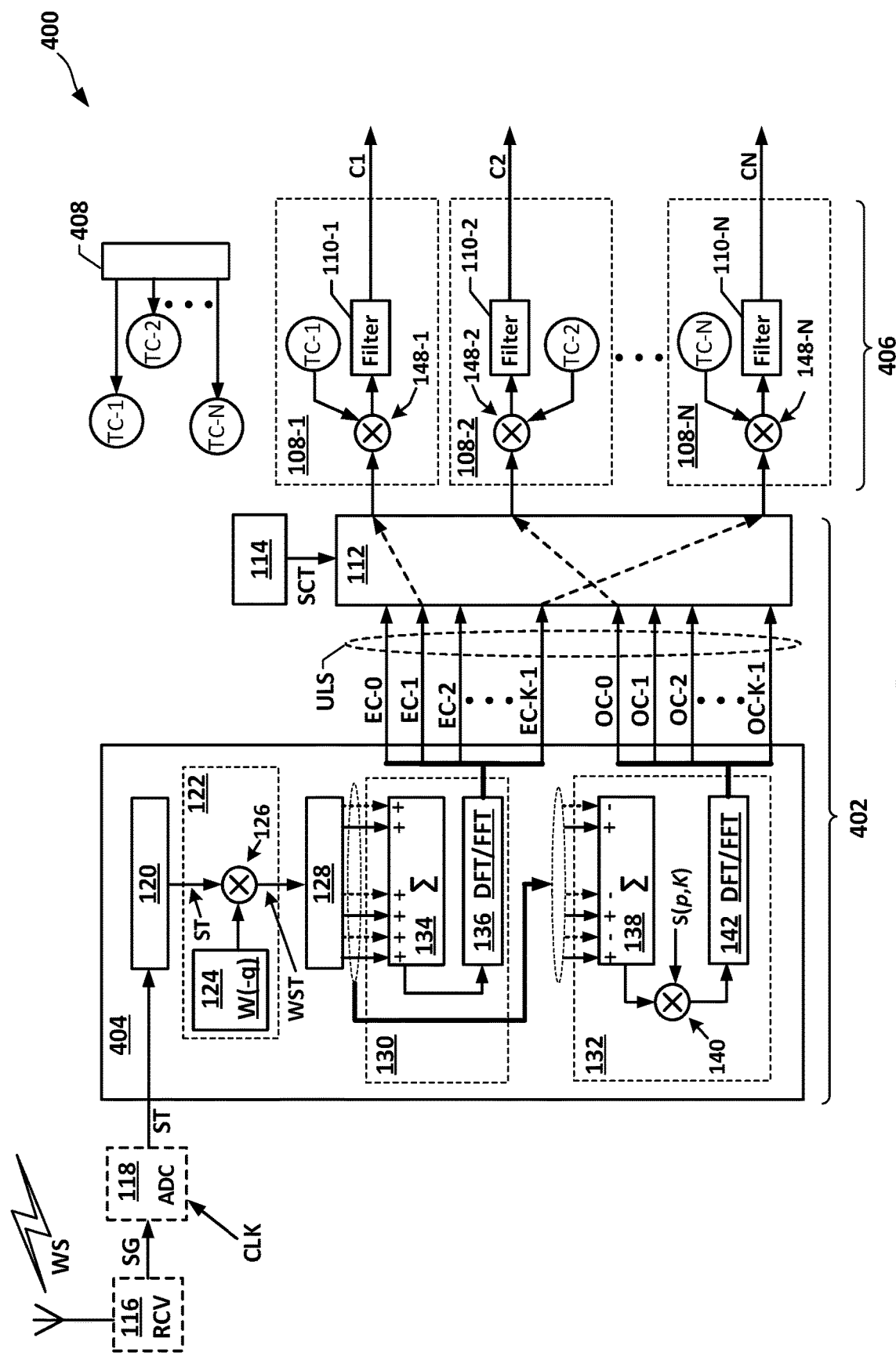
FIG. 4 shows a functional block diagram of an example two-stage channelizer system, including a first stage providing additional computation reduction features, combined with the FIG. 1 resource-conserving aspects of its RSC WOLA SBF logic, and a second stage configured with complementary merged post-FFT adjustment according to various aspects.

FIG. 4 shows a functional block diagram of an implementation that can effectively remove the first and second post-FFT adjustment logics 136 and 138, and the complex multiplication operations they perform. The FIG. 4 functional block diagram is of an example two-stage channelizer system 400, including a first stage 402 featuring additionally reduced computation RSC WOLA SBF logic 404, and second stage 406 configured with complementary merged post-FFT adjustment according to various aspects. In an example implementation, the system 400 can implement RSC WOLA SBF logic 404 with a reduced sub-set of the above-described items or components of the above-described first stage 102, in combination with low complexity modifications of the second stage 104. As will be described in subsequent paragraphs, technical features of the two-stage channelizer system 400 include, but are not limited to, a net reduction in complexity compared to the FIG. 1 system 100. For example, the FIG. 4 simplified first stage 402 can include removing from the RSC WOLA SBF logic 106 the first post-FFT adjustment complex multiplication logic 144 and the second post-FFT adjustment complex multiplication logic 146. The system 400, in combination, can modify the system 100 combination tuning controller-signal generator 150 by merging, with its determined individual tuning signals, labelled TL-1, TL2, . . . , TL-N on FIG. 1, a particular adjustment. FIG. 4 labels the adjusted tuning signals as TC-1, TC-2, . . . , TC-N.

The particular adjustment can provide achieve the same overall adjustment for which the FIG. 1 system 100 requires the first post-FFT adjustment logic complex multiplication logic 140 and the second post-FFT adjustment logic complex multiplication logic 142.

The outputs of the RSC WOLA SBF logic 404 can differ from the ES-0, ES-1, . . . , ES-K-1 values and OS-0, OS-1, . . . , OS-K-1 values, because of omitting the first and second post-FFT complex multiplication logic 144-146. This difference is represented by labeling such outputs as EC-0, EC-1, . . . , EC-K-1 and OC-0, OC-1, . . . , OC-K-1 (collectively referred to as "first stage 402 sub-bands ULS"). The logic 400 enables the first FFT logic 136 and second FFT logic 140 to directly feed, through the cross-bar switch 112, the inputs to the N tunable pass-band filtered channel paths 108. The logic 400 can obtain a significant net reduction in computation, as it does not move the first and second post FFT adjustment multiplication to another position. It removes the adjustment multiplication, and inserts a materially different, far simpler operation that obtains the same result.

Figure 5A:
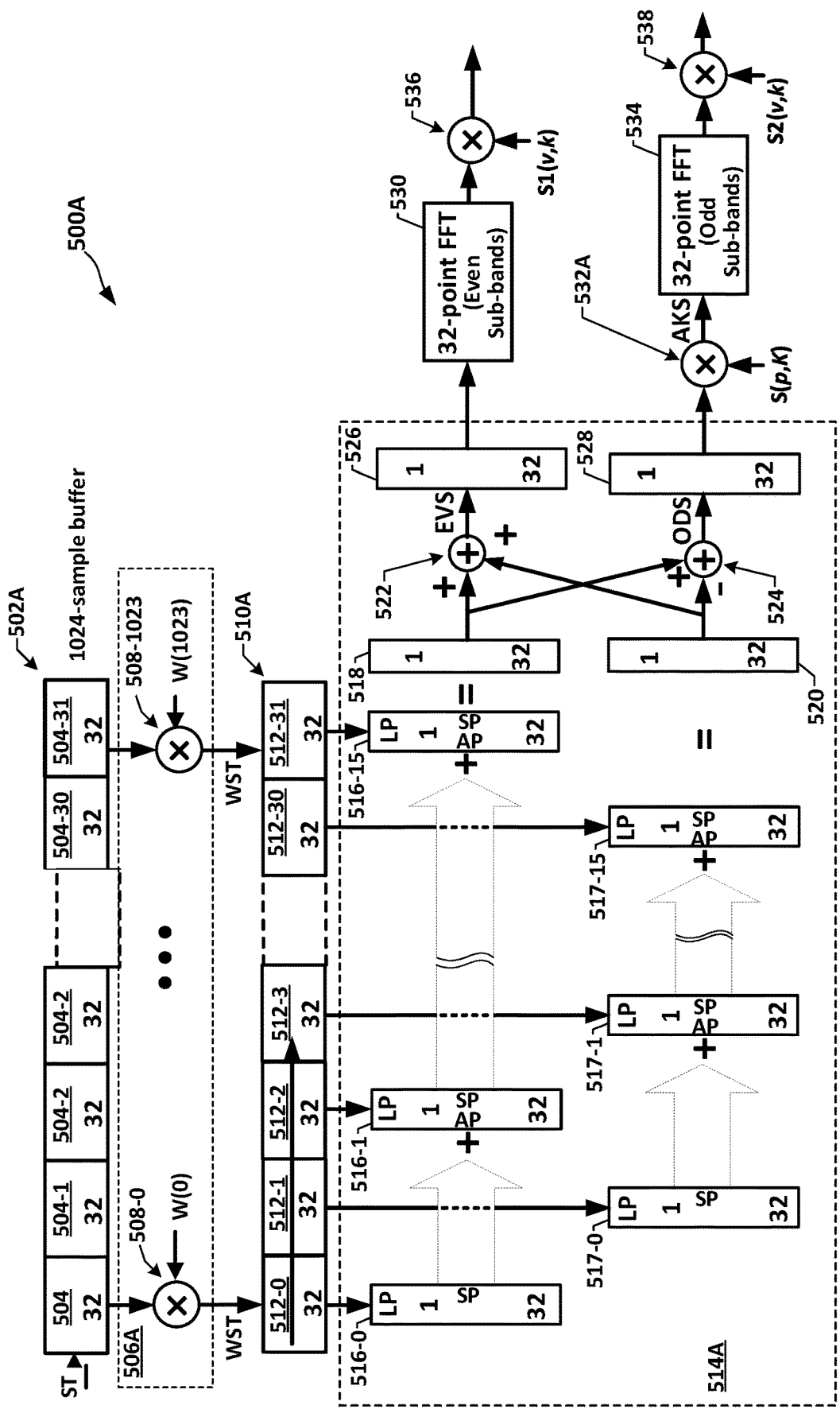
FIG. 5A shows a functional block schematic of a first example decimation configuration, in one implementation of a variable decimation RSC WOLA SBF logic according to various aspects.
Figure 5B:
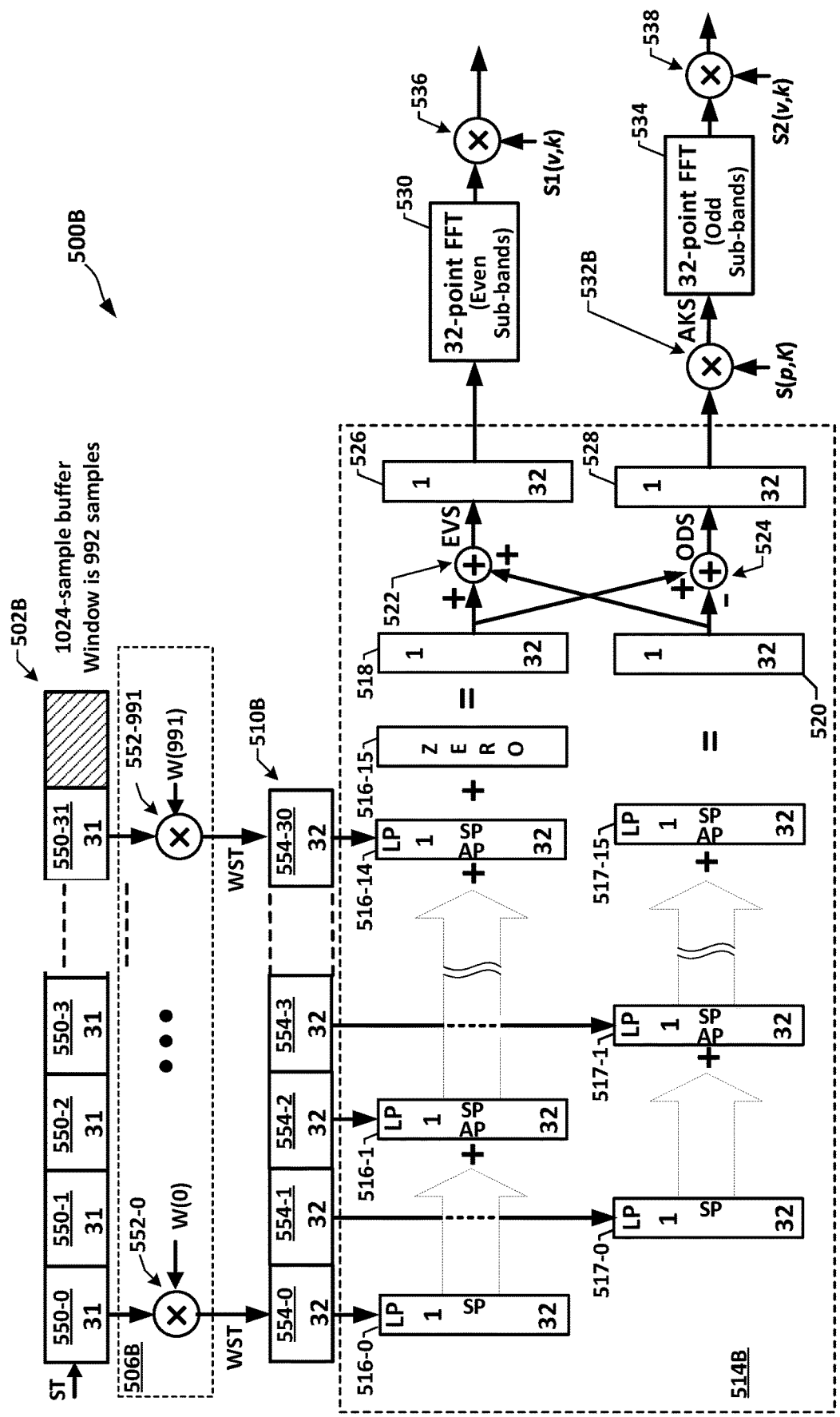
FIG. 5B shows a functional block schematic of a second example decimation configuration of the FIG. 5A in implementation of a variable decimation, RSC WOLA SBF logic according to various aspects.

FIG. 5A shows a functional block schematic of a first example decimation configuration 500A, in one implementation of a variable decimation RSC WOLA SBF logic in accordance with this disclosure. The configuration 500A can include setting, for example, at time of manufacture, or time of installation, or "on-the-fly," or any combination of sub-combination thereof, the size K of the first FFT logic 330 and the second FFT logic 334 to be integer 32. The configuration 500A can also include setting D, the decimation rate, as integer 32. The setting of D can be performed, for example, at time of manufacture, or at time of installation, or "on-the-fly," or any combination of sub-combination thereof. FIG. 5B shows a second example decimation configuration 500B that maintains K at 32 but provides a decimation of 31. To avoid introducing and describing another example set of components for another system implementation, FIGS. 5A and 5B show configurations 500A and 500B as based on the FIG. 3 system 300. However, it will be understood that features and aspects described in reference to the FIG. 5A and FIG. 5B examples are not limited to the FIG. 3 system 300.

Referring to FIG. 5A, the window buffer 502A can be a configuration of the FIG. 3 input buffer 302, providing a sliding window concatenation of integer 32 raw sample ST blocks 504-0, 504-1, 504-2, 504-3, . . . , 504-30, 504-31 (collectively "raw sample ST blocks 504"). Each raw sample ST block 504 can include D=integer 32 raw samples. The value "L" for the window buffer 502A, in accordance with L being the multiplication product of K and D, can be integer 32 multiplied by integer 32, which is integer 1024. The window weighting logic 506 can be a configuration of the FIG. 3 window weighting logic 306, with multiplier logic 508 having integer 32 instances, labeled 508-0, . . . , 508-31, and W(−q) weights configured for a window width L of integer 1024 samples.

The first decimation configuration 500A regrouping buffer 510A can be a configuration of the FIG. 3 regrouping buffer 310, grouping WST from the weighting logic 506A into integer 32 blocks of weighted samples WST, labeled 512-0, 512-1, 512-2, 512-3, . . . , 512-31 (collectively "WST blocks 512"). The WST blocks 512 can be in an alternating even-odd arrangement, of integer 16 even WST blocks 512-0, 512-2, . . . , 512-31 and integer 16 odd WST blocks 512 512-1, 512-3, . . . , 512-30. The WOLA summing logic 514A can be a configuration of the FIG. 3 WOLA summing logic 314, formed of a first integer 16 32-element summing registers, 516-0, 516-1, . . . , 516-15 (collectively "even summing registers 516") and of another integer 16 32-element summing registers, 517-0, 517-1, . . . , 517-15 (collectively "odd summing registers 517"). Operation of WOLA summing logic 514A can produce, for every loading of 502A with another 32 ST samples, another time-folded 32-element block EVS, in accordance with Equation (1), and another alternating sign summation, time-folded 32-element block ODS, in accordance with Equation (2), with Equations (1) and (2) being configured for K=D=32.

Since D=K=32 operation of the regrouping by the regrouping buffer 510A may be omitted. The adjustment logic 532A can be a configuration of the pre-FFT adjustment logic 332 with Equation (3) modified for K=integer 32. The first FFT logic 530 and second FFT logic 534 can be respective K=32 configurations of the FIG. 3 first and second K-point FFT logics 330 and 334. The first post-FFT adjustment logic 536 and second post-FFT adjustment logic 538 can be respective configurations of the FIG. 3 first post-FFT adjustment logic 336 and second post-FFT adjustment logic 338, with the applied Equations (4) and (5) configured for K=D=integer 32.

Example operations of the FIG. 5A decimation configuration 500A will be described assuming, as a start state, the FIG. 5A window buffer 502A having been filled with integer 1024 raw samples ST, arranged as integer 32 raw sample ST blocks 504. Various operations are described in a sequential order, but it will be understood that the sequenced description can be for readability, as implementations are contemplated as configured to perform various of the operations in a parallel, or a pipeline fashion.

A process can begin, for example, upon a cycle clock event, by shifting into the window buffer 502A a new block of integer 32 raw samples ST, and concurrently shifting present 502A content by integer 32 positions, i.e., one block 504. Upon shifting the 32 raw samples ST, the window buffer 502A can feed the 1024 raw samples ST to the window weighting logic 506. Upon completion of the weighting operations, the regrouping buffer 510A can hold integer 1024 weighted samples WST as a concatenation of K=integer 32 blocks, each being 32 weighted samples ST. The regrouping buffer 510A can load the integer 32 blocks of WST samples into the WOLA summing logic 514A, whereupon integer 16 of the integer 32 blocks of WST samples, spaced apart from one another by 32 samples can be loaded into the 16 even summing registers 516, and the remaining integer 16 of the 32 blocks of WST samples can be loaded into the 16 odd summing registers 517. The rightmost even summing register, 516-15, can output a corresponding 32-element even block partial sum, and the rightmost odd summing register, 517-15, can output a corresponding 32-element odd block partial sum. The first 32-element sum combiner 522, in response, can provide a first 32-element completed sum, ODS, according to Equation (1), and the second 32-element sum combiner 524, by subtracting the odd block partial sum from the even block partial sum, can provide a second 32-element completed sum, ODS, according to Equation (2).

Continuing with description of example operations of the first configuration 500A, the latch 526 can provide the first 32-element completed sum, EVS, to the first 32-point FFT logic 530, and the latch 528 can provide the second 32-element completed sum to the adjustment logic 532, which feeds a corresponding AKS to the second 32-point FFT logic 534. The first post-FFT adjustment logic 536 and second post-FFT adjustment logic 538 respectively apply operations according to Equations (4) and (5), each configured for K=D=integer 32.

The above-described operations can be performed for every cycle of loading another 32-sample block of ST into the window buffer 502A. Therefore, each point of the first 32-point FFT logic 530 and of the second 32-point FFT logic 534 is output once every 32-sample cycle. The decimation is therefore 32.

It will be understood that implementations may pipeline various of the above-described operations. For example, concurrent with window weighting logic 506 performing weighting of the window buffer 502A content of 1024 samples from a given shift, a new 32 raw sample ST block may be shifted into the buffer 502A. As another example, concurrent with generating EVS and ODS corresponding to a given cycle of loading 32 ST samples, the first 32-point FFT logic 530 and second 32-point FFT logic 534 may be respectively generating 32-point FFT results using inputs from a previously cycle's EVS and ODS.

Referring to FIG. 5B, configuration 500B can include window buffer 502B, being another configuration of the FIG. 3 input buffer 302, based on D being 31 instead of 32. The window buffer 502B can be configured to provide a sliding window concatenation of integer 32 raw sample ST blocks, labeled 550-0, 550-1, 550-2, 550-3, ..., 550-30, 550-31 (collectively "raw sample ST blocks 550"). However, since D=integer 31, each raw sample ST block 550 can include integer 31 samples, instead of the integer 32 of the sample blocks 504 held by the FIG. 5A window buffer 502A. The value "L" for the FIG. window buffer 502B can therefore be integer (D×K), which for configuration 500B is 32 multiplied by 31, and L is therefore integer 992. The window weighting logic 506B can be a configuration of the FIG. 3 window weighting logic 308 with the coefficient W(−q) modified as 992 values, and multiplier logic 508 including integer 992 values.

Since D=31 is not equal to K=32, operation of the regrouping buffer 510A can be a configuration of the FIG. 3 regrouping buffer 310 that regroups WST from the weighting logic 506A into blocks of integer 31 weighted 32-element samples WST, labeled 554-0, 554-1, 554-2, 554-3, ..., 554-31 (collectively "WST blocks 554"). The WST blocks 554 can be in an alternating even-odd arrangement, including 16 even WST blocks 554-0, 554-2, ..., 554-30 and 16 odd WST blocks 554-1, 554-3, ..., 554-29.

Operation of WOLA summing logic 514B can produce, for every loading of 502B with another integer 31 ST samples, another time-folded 32-element block EVS, in accordance with Equation (1), and another alternating sign summation, time-folded 32-element block ODS, in accordance with Equation (2), with Equations (1) and (2) being configured for K=32 and D=31. The first post-FFT adjustment logic 536B and second post-FFT adjustment logic 538B can be respective configurations of the FIG. 3 first post-FFT adjustment logic 336 and second post-FFT adjustment logic 338, with the applied Equations (4) and (5) configured for K=integer 32 and D=integer 31.

The above-described second decimation configuration 500B can produce, for every cycle of shifting another 31 sample of ST into the window buffer 502B, another 32-point FFT output from the first FFT logic 530 and another 32-point FFT from the second FFT logic 534. Therefore, each point of the first 32-point FFT logic 530 and of the second 32-point FFT logic 534 is output once every 31-sample cycle. The decimation is therefore 31.

The FIG. 5A window buffer 502A and the FIG. 5B window buffer 502B can be respective modes or states of a common buffer resource (not explicitly visible). The shared or common buffer resource can have a capacity or maximum depth, for example, of the largest "L" value, which for this example is integer 1024. The FIG. 5B window buffer 502B can, for example, disable or zero the contents of the buffer resource for positions 992 through 1023.

The FIGS. 5A and 5B values D, K, and L are arbitrary examples, not intended as any limitation, explicit or implicit, or as any statement of preferred absolute values or preferred relative values of D, K, and L.

Figure 6:
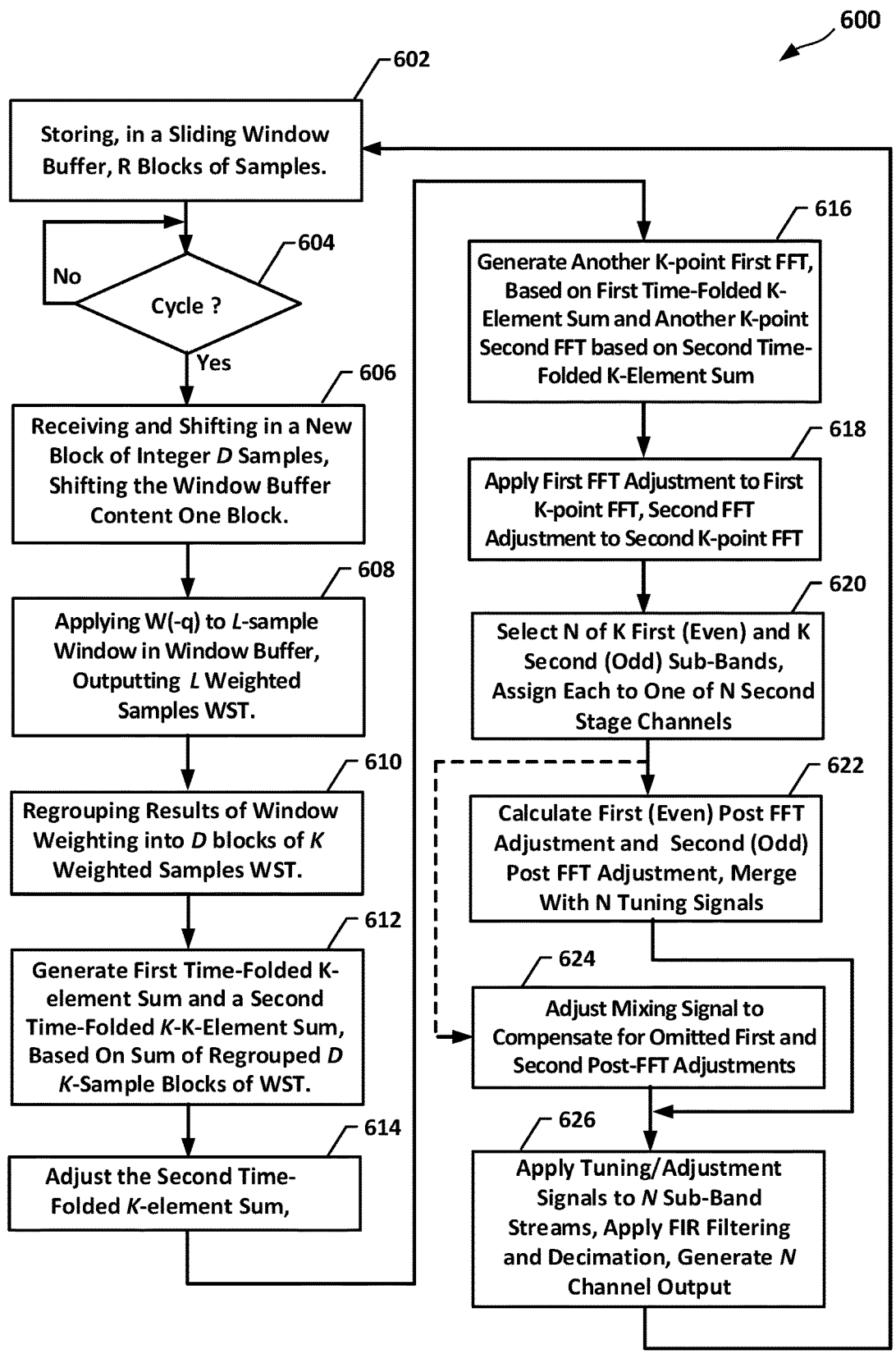
FIG. 6 shows a flow diagram, representing example operations in a process in one or more methods and systems for resource-conserving channelization, according to various aspects.

FIG. 6 shows a flow diagram, representing example operations in a flow 600 in in one or more methods and systems for RSC WOLA SBF, according to various aspects. An instance of the flow 600 can start at 602, where operations can be applied for storing, in a sliding window buffer, having a FIFO configuration, blocks of samples, each including a block of first signal samples and a block of second signal samples.

From 602, the flow 600 can proceed to 604 to determine if a shift-in cycle has occurred. It will be understood that operations at 604 can be a wait-until configuration. If the answer is No, the flow 600 can loop back, and continue until the answer is Yes. Upon receiving a Yes at 604, the flow 600 can proceed to 606 and apply operations for receiving and shifting in a new block of integer D samples, shifting the FIFO window buffer content (e.g., the content of FIG. 3 window buffer 302) by one block. The content of the FIFO window buffer can be integer L, which is K multiplied by D. From 606, the flow 600 can proceed to 608, where operations can be applied for applying W(−q) to the L-sample window content of the FIFO buffer, and outputting a resulting L weighted samples WST. One example of operations such as applied at 608 can be FIG. 3 weighting logic 306 applying W(−q) to the L sample ST content of the window buffer 302.

In an example instance, upon completion of operations at 608, the flow 600 can proceed to 610, where operations can be regrouping the results of the window weighting into integer D blocks of integer K weighted samples WST. One example of operations such as applied at 610 can be the above-described operations of the FIG. 3 regrouping buffer 310 operating on the results of the window weighting logic 306. From 612, the flow 600 can proceed to 614, where operations can be generating a first time-folded K-element sum and a second time-folded K-element sum, each based on an element-by-element sum of the integer D K-sample blocks of weighted samples, as regrouped by the regrouping buffer. One example of operations such as applied at 614 can be the above-described generation, by the FIG. 3 time-folding logic 314 logic, of another time-folded K-element block EVS in accordance with Equation (1), and another alternating sign summation, time-folded K-element block ODS, in accordance with Equation (2).

From 614 the flow 600 can proceed to 616, to adjust the second time-folded K-element sum, such as the operations applied by the FIG. 3 pre-FFT adjustment logic 332, and from 616 can proceed to 618 to generate another K-point first FFT, based on the first time-folded K-element sum and another K-point second FFT based on another alternating sign summation forming the second time-folded K-element sum. One example of operations such as applied at 618 can be the above-described generation, by the first K-point FFT logic 330 of another first K-point FFT results and the described generation, by the second K-point FFT logic 334 of another second K-point FFT result.

From 618, the flow 600 can proceed to 620, and apply operations of a first FFT adjustment to the results of the first K-point FFT, and operations of a second FFT adjustment to the results of the second K-point FFT. One example of operations such as applied at 620 can be the above-described first post-FFT adjustment, applied by the FIG. 3 first post FFT adjustment logic 336, and the described second post-FFT adjustment, applied by the FIG. 3 second post-FFT adjustment logic 338.

In an implementation such as described in reference to FIG. 4, operations at 620 can be omitted, as shown by the dotted line from 620 to 622. The flow 600 can proceed from 620 to 622, where operations can be applied for selecting N among the K first (even) and K (odd) sub-bands and assigning each of the N to a corresponding one of the N second stage channels. For implementations such as described in reference to FIG. 4, the flow 600 can proceed from 622 to 624, where adjusted band-pass filter tuning signals can be generated, incorporating a compensation for the omitted first and second post FFT adjustments. From 624, or directly from 634, the flow 600 can proceed to 626 where operations can apply tuning/adjustment signals to the N selected sub-band streams, then for each of the N, apply FIR filtering and decimation to generate N channels of output.

Figure 7:
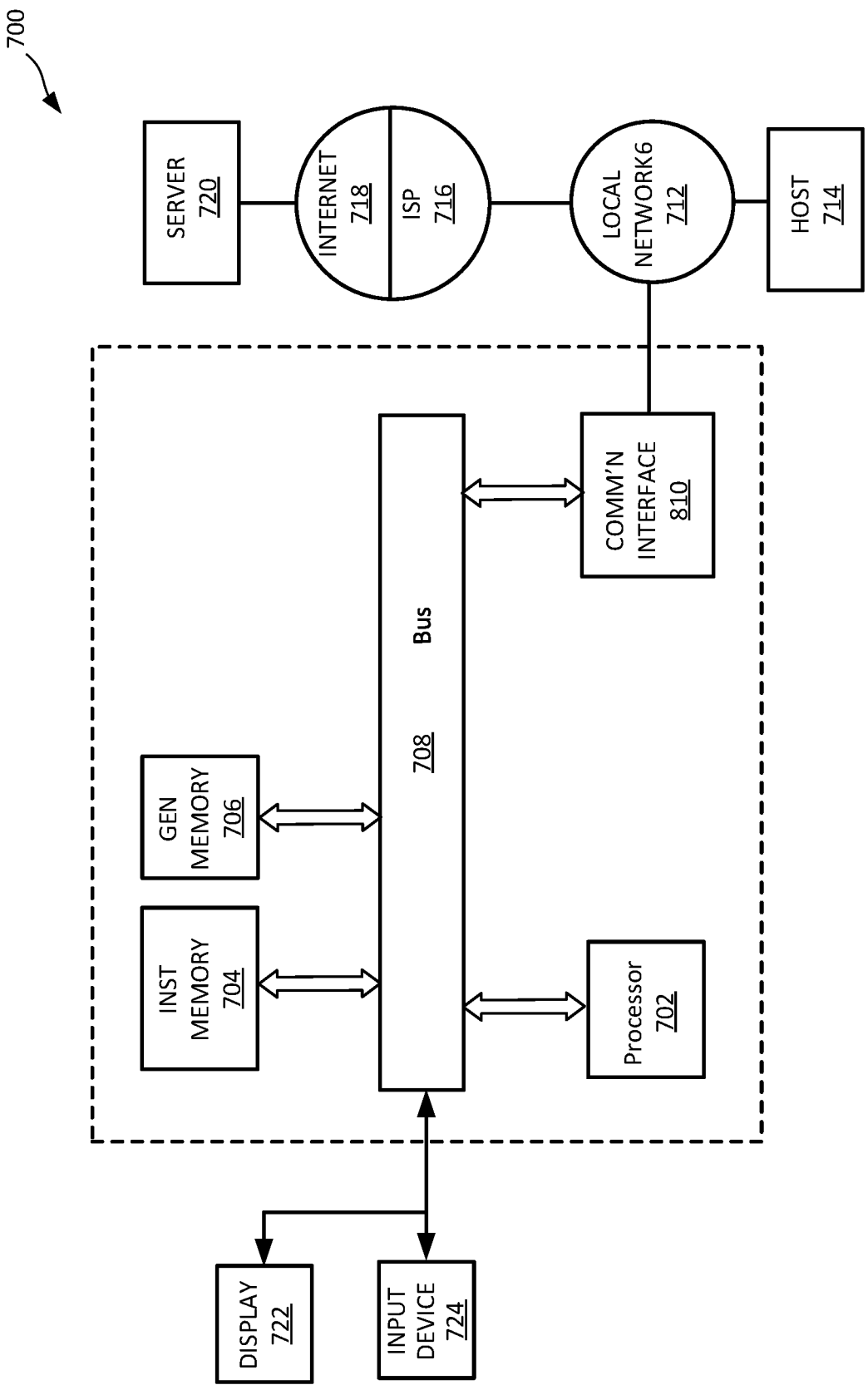
FIG. 7 is a functional block diagram of an example computer system upon which aspects of this disclosure may be implemented.

FIG. 7 is a block diagram illustrating a computer system 700. It will be understood that logic blocks illustrated in FIG. 7 represent functions, and do not necessarily correspond to particular hardware on a one-to-one basis. The computer system 700 can include a data processor 702, instruction memory 704, and a general purpose memory 706, coupled by a bus 708. The instruction memory 704 can include a tangible medium retrievably storing computer-readable instructions, that when executed by the data processor 702 cause the processor to perform functions, processes, and operations according to one or more aspects of this disclosure.

The computer system 700 can include a communications interface 710 configured to interface with a local network 712 for accessing a local server 714, and to communicate, for example, through an Internet Service Provider (ISP) 714 to the Internet 716, and access a remote server 720. The computer system 700 can also include a display 720 and a user interface or other input device 722, either as separate devices or combined, for example, as a touchscreen display.

Those of skill in the pertinent art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Various exemplary aspects and illustrative implementations thereof are described in terms of sequences of actions performed, for example, by elements of a computing device. It will be recognized that such actions described can be performed by specific circuits (for example, application specific integrated circuits (ASICs)), by specific configurations of field programmable circuits (for example, field programmable gate arrays (FPGAs)), by program instructions being executed by one or more processors, or by a combination of both. Additionally, such sequence of actions described herein can be considered to be implemented entirely within any form of computer readable storage medium having stored therein a corresponding set of computer instructions that upon execution would cause an associated processor to perform the described herein. Thus, the various aspects of can be implemented in a number of different forms, all of which are contemplated to be within the scope of the claimed subject matter. In addition, example forms and implementations for actions and operations may be described, for example, as "logic configured to" perform the described action.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, implementations and practices according to the disclosed aspects can include a computer readable media embodying a method for de-duplication of a cache. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A channelizer comprising:
    a window buffer, configured to store a sequence of signal samples;
    a weighting logic, coupled to the window buffer, configured to apply a sequence of weighting coefficients to the sequence of signal samples, and output a corresponding sequence of weighted signal (WST) samples;
    a regrouping logic, configured to group the WST samples into a concatenation of D WST sample blocks, each of the D WST sample blocks including K WST samples, K being an integer;
    a time folding logic, configured to generate a first time-folded sum, based at least in part on a summation of the D WST sample blocks, and a second time-folded sum based at least in part on a summation of a first plurality of the D WST sample blocks and a subtraction of a second plurality of the D WST sample blocks;
    a mixer logic, configured to frequency shift the second time-folded sum and output a corresponding adjusted second time-folded sum;
    a first discrete Fourier Transform logic, configured to generate a first plurality of bandpass outputs, based at least in part on applying a discrete Fourier Transform to the first time-folded sum; and
    a second discrete Fourier Transform logic, configured to generate a second plurality of bandpass outputs, based at least in part on applying a discrete Fourier Transform to the adjusted second time-folded sum.

2. The channelizer of claim 1, wherein the window buffer is configured t0:
    store integer L of the signal samples as a concatenation of K blocks, each of the K blocks including another D signal samples, and
    at each cycle in a sequence of cycles, shift in a new block of signal samples, and correspondingly shift each of the current blocks of D signal samples by one D signal sample block,
    wherein the time folding logic is further configured to generate, at each of the cycles, another first time-folded sum and another second time-folded sum, the another first time-folded sum being based at least in part on a summation of another D blocks of K signal samples, and the another second time-folded sum being based at least in part on a summation of a first plurality of the D blocks and a subtraction of a second plurality of the D blocks.

3. The channelizer of claim 2, wherein:
    the cycles are performed at a cycle rate,
    generating the first plurality of bandpass outputs generates, at the cycle rate, updated values of the first plurality of bandpass outputs,
    generating the second plurality of bandpass outputs generates, at the cycle rate, updated values of the second plurality of bandpass outputs, and
    the cycle rate is a decimation of the given sampling rate, the decimation being based, at least in part, on D.

4. The channelizer of claim 3, further comprising a decimation change controller, configured to receive a decimation change command and, in response, to generate a decimation control signal, and wherein:
    the window buffer is configured to adjust D, based at least in part on the decimation control signal.

5. The channelizer of claim 4, wherein:
    the first discrete Fourier Transform logic is configured as a first K-point Fast Fourier Transform logic, and
    the second discrete Fourier Transform logic is configured as a second K-point Fast Fourier Transform logic, and
    the decimation change controller is configured to adjust D such that a multiplication product of K and D conforms to L.

6. The channelizer of claim 5, wherein:
    the decimation change controller is further configured to generate, based at least in part on the decimation change command, a K adjust control signal,
    the first K-point FFT logic and second K-point FFT logic are configured to adjust K, based at least in part on the K adjust control signal, and
    the decimation change controller is further configured to generate K, and to adjust D such that a multiplication product of K and D conforms to L.

7. The channelizer of claim 1, wherein:
    the first discrete Fourier Transform logic is configured as a first K-point Fast Fourier Transform (FFT) logic, and
    the second discrete Fourier Transform logic is configured as a second K-point FFT logic.

8. The channelizer of claim 7, wherein, the first plurality of bandpass outputs is a first plurality of first-level bandpass outputs, the second plurality of bandpass outputs is a second plurality of first-level bandpass outputs, and wherein the channelizer further comprises:
    a channel selector switch, including a plurality of selector inputs and integer N selector outputs, configured to:
        receive at the selector inputs at least a portion of the first plurality of first-level bandpass outputs, or at least a portion of the second plurality of first-level bandpass outputs, or both,
        receive a channel select command that indicates a specific selector input among the plurality of selector inputs, and a specific selector output among the plurality of selector outputs and, in response, establish a connection between the specific selector input and the specific selector output.

9. The channelizer of claim 8, wherein the channelizer further comprises:
    a post FFT adjustment and tuning logic, configured to receive a post FFT frequency adjustment data and a center-frequency tuning data and, based at least in part on the post FFT frequency adjustment data and center-frequency tuning data, generate an adjusted center-frequency tuning signal; and
    a mixer logic, coupled to the specific selector output, and configured to frequency shift a first-level bandpass output signal from the specific selector output, based at least in part on the adjusted center-frequency tuning signal, and to output a corresponding filter-aligned bandpass feed signal.

10. The channelizer of claim 9, further comprising a low pass filter, coupled to the mixer logic, and having a low pass filter center frequency, wherein:
    the post FFT adjustment and tuning logic is configured to generate the adjusted center-frequency tuning signal at a frequency that aligns the filter-aligned bandpass feed signal to the low pass filter center frequency.

11. A method for channelizing, comprising:
    shifting a new block of D new samples into a window buffer, D being an integer;

applying weighting coefficients to a window of L samples from the window buffer and outputting corresponding weighted signal (WST) samples, L being an integer;

re-grouping the WST samples into a plurality of WST sample blocks;

time folding the plurality of WST sample blocks according to a first time-folding process, to generate a first K-element sum, K being an integer, and time folding the plurality of WST sample blocks according to a second time-folding process, to generate a second K-element sum;

frequency adjusting the second K-element sum to generate an adjusted second K-element sum;

generating a first plurality of bandpass outputs, based at least in part on applying a discrete Fourier Transform to the first K-element sum; and generating a second plurality of bandpass outputs, based at least in part on applying a discrete Fourier Transform to the adjusted second K-element sum.

12. The method of channelizing of claim 11, wherein:
the window of L samples is arranged as a concatenation of K first blocks, each of the K first blocks including D samples, and
re-grouping WST into the plurality of blocks includes a regrouping into a concatenation of D second blocks, each of the D second blocks including K samples.

13. The method of channelizing of claim 12, the method further comprising:
at each cycle among a sequence of cycles,
shifting another new block of D new samples into the window buffer, and
generating another first plurality of bandpass outputs, wherein D is a decimation.

14. The method of channelizing of claim 13, further comprising: adjusting the decimation, based at least in part on adjusting D.

15. The method of channelizing of claim 14, wherein:
applying the discrete Fourier Transform includes applying a K-point Fast Fourier Transform (FFT),
wherein the method further comprises: adjusting the decimation, based at least in part on adjusting D, or on adjusting K, or both.

16. The method of channelizing of claim 15, wherein:
adjusting D is based at least in part, on maintaining a multiplicative product of K and D in conformance with L.

17. The method of channelizing of claim 11, wherein:
applying the discrete Fourier Transform includes applying a K-point Fast Fourier Transform (FFT), and applying the second discrete Fourier Transform includes applying a K-point FFT,
the first plurality of bandpass outputs is a first plurality of first-level bandpass outputs, the second plurality of bandpass outputs is a second plurality of first-level bandpass outputs, and wherein the method further comprises:
receiving, at selector input ports of a selector switch having a plurality of input ports and a plurality of output ports, at least a portion of the first plurality of first-level bandpass outputs, or at least a portion of the second plurality of first-level bandpass outputs, or both,
receiving at the selector switch a channel select command and, in response, establishing a connection between a specific input port and a specific output port;
receiving a post FFT frequency adjustment data and a center-frequency tuning data and, based at least in part on the post FFT frequency adjustment data and center-frequency tuning data, generating a post FFT adjusted center-frequency tuning signal; and
frequency shifting an input at the input port, based at least in part on the post FFT adjusted center-frequency tuning signal, and outputting a corresponding filter-aligned bandpass output signal.

18. The method of channelizing of claim 17, wherein the method further comprises:
low pass filtering the filter-aligned bandpass output signal,
wherein:
low pass filtering the filter-aligned bandpass output signal is configured with a low pass filter center frequency, and
generating the post FFT adjusted center-frequency tuning signal is configured to generate the post FFT adjusted center-frequency tuning signal at a frequency that aligns the filter-aligned bandpass output signal to the low pass filter center frequency.

19. A channelizer comprising:
a window buffer, configured to hold a sliding window of integer L signal samples;
a weighting logic configured to apply a weighting to the L signal samples and output corresponding weighted signal (WST) samples;
an overlap-add (OLA) logic, configured to generate a first K-element OLA sum and a second K-element sum, each kth element of the first K-element OLA sum being based at least in part on a sum of kth symbols in each of a plurality of blocks of the K WST samples, the plurality of blocks of K WST samples including first blocks and second blocks, and each kth element of the second K-element OLA sum based at least in part on a sum of respective kth symbols of the second blocks subtracted from a sum of kth symbols of the first blocks;
a phase adjustment logic that can be configured to apply a phase adjustment to the second K-element OLA sum and generate a corresponding adjusted second K-element OLA sum;
a first discrete Fourier Transform logic, configured to apply a K-point first discrete Fourier Transform to the first K-element OLA sum and output a resulting first plurality of sub-band outputs; and
a second discrete Fourier Transform logic, configured to apply a K-point second discrete Fourier Transform to the adjusted second K-element OLA sum, and output a resulting second plurality of sub-band outputs.

20. The channelizer of claim 19, wherein:
a decimation control logic, coupled to the window buffer, configured to selectively adjust a decimation rate of the first plurality of sub-band outputs and of the second plurality of sub-band outputs, wherein the adjusting includes selectively adjusting D of the window buffer;
the decimation change controller is further configured to adjust the decimation, based at least in part on adjusting D, or on adjusting K, or both.

21. The channelizer of claim 20, wherein:
adjusting D is based at least in part, on K and L, including maintaining a multiplicative product of K and D in conformance with L, and
adjusting K is based at least in part, on D and L, including maintaining a multiplicative product of K and D in conformance with L.

* * * * *